United States Patent
Eckert et al.

(10) Patent No.: US 7,092,310 B2
(45) Date of Patent: Aug. 15, 2006

(54) MEMORY ARRAY WITH MULTIPLE READ PORTS

(75) Inventors: Martin Eckert, Jettingen (DE); Juergen Pille, Stuttgart (DE); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 11/010,902

(22) Filed: Dec. 13, 2004

(65) Prior Publication Data

US 2005/0135179 A1    Jun. 23, 2005

(30) Foreign Application Priority Data

Dec. 19, 2003   (DE) .............................. 031 01 836

(51) Int. Cl.
  *G11C 8/00*   (2006.01)
(52) U.S. Cl. ............. 365/230.05; 365/154; 365/189.02
(58) Field of Classification Search ................ 365/154, 365/189.02, 230.05
  See application file for complete search history.

(56) References Cited

U.S. PATENT DOCUMENTS 3,975,623 A    8/1976   Weinberger ................. 235/152
5,590,087 A *  12/1996  Chung et al. ............. 365/230.05
5,754,468 A    5/1998   Hobson ....................... 365/156
6,535,963 B1 * 3/2003   Rivers ........................ 711/149

FOREIGN PATENT DOCUMENTS

EP    0591752 B1    9/1993

* cited by examiner

*Primary Examiner*—Hoai V. Ho
(74) *Attorney, Agent, or Firm*—John E. Campbell; Lawrence D. Cutter

(57) ABSTRACT

A multiport array comprises a read section which is separated from an array of memory cells and which forms a plurality of data-out ports each consisting of a predetermined number of output lines. The read section comprises a multiplex network containing a plurality of multiplex arrays each associated with one of the data-out ports (0,1, . . . ,15). The multiplex arrays are connected to the data read lines of the memory cells and are selected by read addresses. The multiplex arrays comprise transmission elements which connect selected ones of the data read lines to the associated data-out port.

24 Claims, 7 Drawing Sheets

MEMORY ARRAY WITH MULTIPLE READ PORTS

FIELD OF THE INVENTION

The invention invention relates to a multiport array comprising an array of memory cells located at intersections of data write lines and word select lines. The invention also relates to a method for operating the multiport array.

BACKGROUND OF THE INVENTION AND PRIOR ART

Multiport arrays are important for computer systems which require concurrent access to a data storage at the same time. This in particular applies to parallel systems comprising a large number of processors. In such systems typically a large amount of instructions and data are processed in parallel including a multiple access to the same memory.

Various dynamic static multiport memory cells are known for the use in random access memory arrays in the VLSI system design. For example, EP 0 591 752 discloses a dynamic multiport memory cell comprising pairs of memory cells at the intersections of a pair of bit lines and a pair of word lines. This device uses a random access port and a serial access port. Data are transmitted from the random access port to serial access port via a data register.

U.S. Pat. No. 5,754,468 discloses a static random access memory cell which comprises three P-type transistors and three N-type transistors to form a two port memory cell which can be configured to perform as a one port or two port memory cell. Additional ports can be added to allow, for example, the use of the cell in a three port register array.

Implementations of multiport arrays require normally as many input/output terminals as the number of concurrent accesses occur at the same time. Major problems of the physical implementation of multiport arrays are the available chip area per memory cell and the power consumption. The more ports an array has the more chip area is needed for the implementation where the increase follows a square function. These problems usually require a custom design which is time consuming and inflexible for being extended or otherwise changed later one.

Real multiport arrays have the structure of a matrix of signal lines, one of which selecting a cell and another one for reading/writing the data, where each cross lays above an storage element. Increasing the number of ports from 1 to 2 would mean to design a matrix of 2 by 2 signal lines with the same single bit as storage element below this matrix and so on. This leads to a rapid increase of the cell area when the number of ports is increased.

Conventional implementation techniques of real multiport arrays use a matrix structure which results in an area increase function $x^2$ (x=number of ports). The exact number depends on the ratio silicon to wire and is also dependant whether a SRAM cell or a register cell is used. Data out control and signal lines for data out ports are combined with the storage elements within the same area.

There are also possibilities to built logical n-port arrays by implementing n physical single port arrays which hold the same data. It needs n times the area of the single port array.

If the array operation cycle is long enough it is also possible to read the storage elements several times in sequence within one cycle. In this manner a logical n-port array can be implemented as a single port array which is read n times in order to provide the same information as a real n port array.

It is also known to use multiport structures in programmable logic arrays (PLA). U.S. Pat. No. 3,975,623 discloses a PLA which comprises a segmented OR part where the segments are arranged at opposite sides of an AND part of the array. The output lines of the AND part are splitted into two groups of ports each of which is connected to the segments of the OR array.

SUMMARY OF THE INVENTION

The invention provides improvements of multiport arrays comprising an array of memory cells which are located at intersections of bit write lines and word select lines and comprise data read lines. According to the invention, as defined in the claims, a multiport array comprises a read section which is separated from the array of memory cells and form a plurality of data-out ports each consisting of a predetermined number of lines. The read section comprises a plurality of bit select arrays each associated with one of the data-out ports. The bit select arrays are connected to the data read lines of the memory cells and comprise transmission elements which connect selected ones of the data read lines to selected ones of the lines in the associated data-out port.

According to one aspect of the invention the bit select arrays comprise address lines for addressing a data-out port for data read out operation. The addressing may be such that more than a data read-out operation on more than one data-out port is simultaneously performed.

According to another aspect of the invention the memory cells of the memory array are static cells which provide continuing output signals for all memory cells in parallel. Due to the static read out signals of the memory array power saving may be achieved by activating only those ports from which an output is wanted while the other ports remain inactive.

In a preferred implementation of the invention, each of the bit select arrays comprises a multiplex array having first lines which are connected to the data read lines of the memory cells and the second lines which intersect with the first lines. The second lines select at least one of the first lines for being connected to output lines of the multiplex arrays by conditioning transmission gates located at the intersections between the first and second lines.

The multiport array according to the invention is based on a modular design and allows an expansion to a large number of ports. The multiport array supports of a full data output or a partially multiplex data output which is usable for perform logical functions. The multiport array of the invention also allows a reduced test time for the physical wafer, chip and module tests.

A method according to the invention, as defined in the claims, comprises the steps of:

separating from the array of memory cells a read section comprising a plurality of data-out ports each consisting of a predetermined number of lines;

dividing the read section into a plurality of bit select arrays each associated with one of the data-out ports;

connecting the bit select arrays in series to the data read lines of the memory cells; and transmitting by a bit select array data signals on selected ones of the data read lines to selected ones of the lines in the associated data-out port.

The method according to the invention provides an addressing of the bit select arrays for selecting at least one of the plurality of data-out ports for a data read-out operation. The addressing may be such that a parallel data read-out on more than one data-out ports is performed.

According to the method of the invention the memory cells of the memory array generate a continuing output signal which is supplied from the memory cells of the memory array to the plurality of bit select arrays in parallel.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
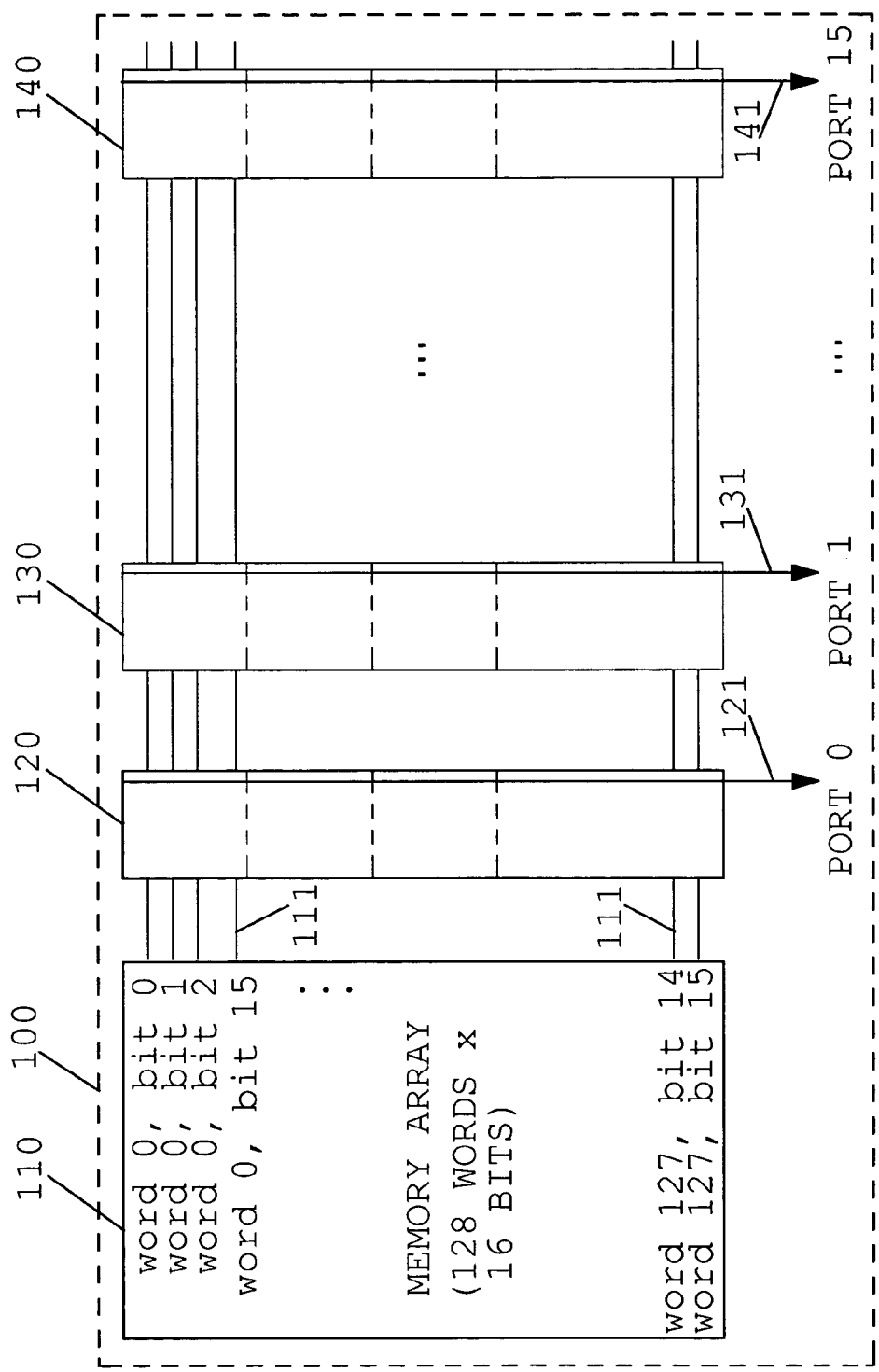
FIG. 1 a high level block diagram of a multiport array in which the principles of the invention are used.

FIG. 1 shows a multiport array 100 suitable for being used in computer systems to store data which are accessible by a plurality of clients. The multiport array 100 comprises an array of memory cells 110 implemented in very large scale integration techniques and organized in a plurality of words each consisting of a number of bits. The array comprises a write port but no selectable read ports. Instead all bits are visible at the output represented in FIG. 1 by horizontal direct data bit lines 111. The array 110 contains memory cells of 128 words each consisting of 16 bits. In FIG. 1 only the data bit lines of the bits 0, 1, 2 and 15 of word 0 and of the bits 14, 15 of word 127 are shown.

A predetermined number of bit select arrays 120, 130, 140 are connected in series to the data bit lines 111. Each of the bit select arrays 120, 130 and 140 is addressable and associated with a data-out port 121, 131 and 141. The multiport array 100 of FIG. 1 may comprise in total 16 bit select arrays which are associated with data-out ports 0,1, . . . , 15. The number of ports may be increased by adding further bit select arrays and further word decoders. The data bit lines 111 lead through all of the bit select arrays and are selectively feeding the ports 0, 1, . . . , 15. Each of these ports comprises a predetermined number of lines each assigned to at least one bit in the data output of the memory array 110. A bit select array 120, 130 or 140 which comprises a number of lines less than the number of data bit lines at its input is preferably designed as a multiplex array.

Figure 2:
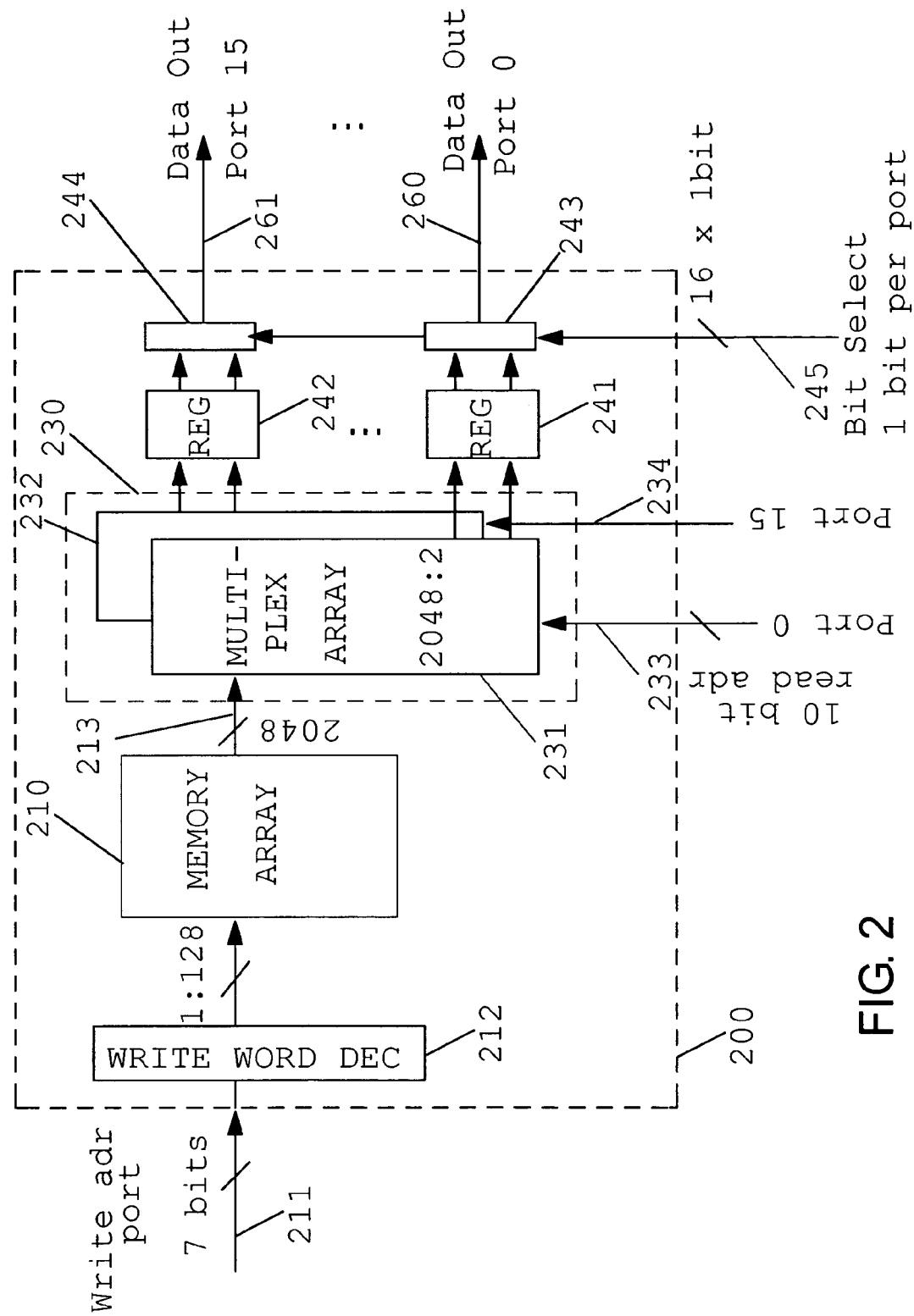
FIG. 2 an implementation of a multiport array according the invention in a block diagram representation.
Figure 3:
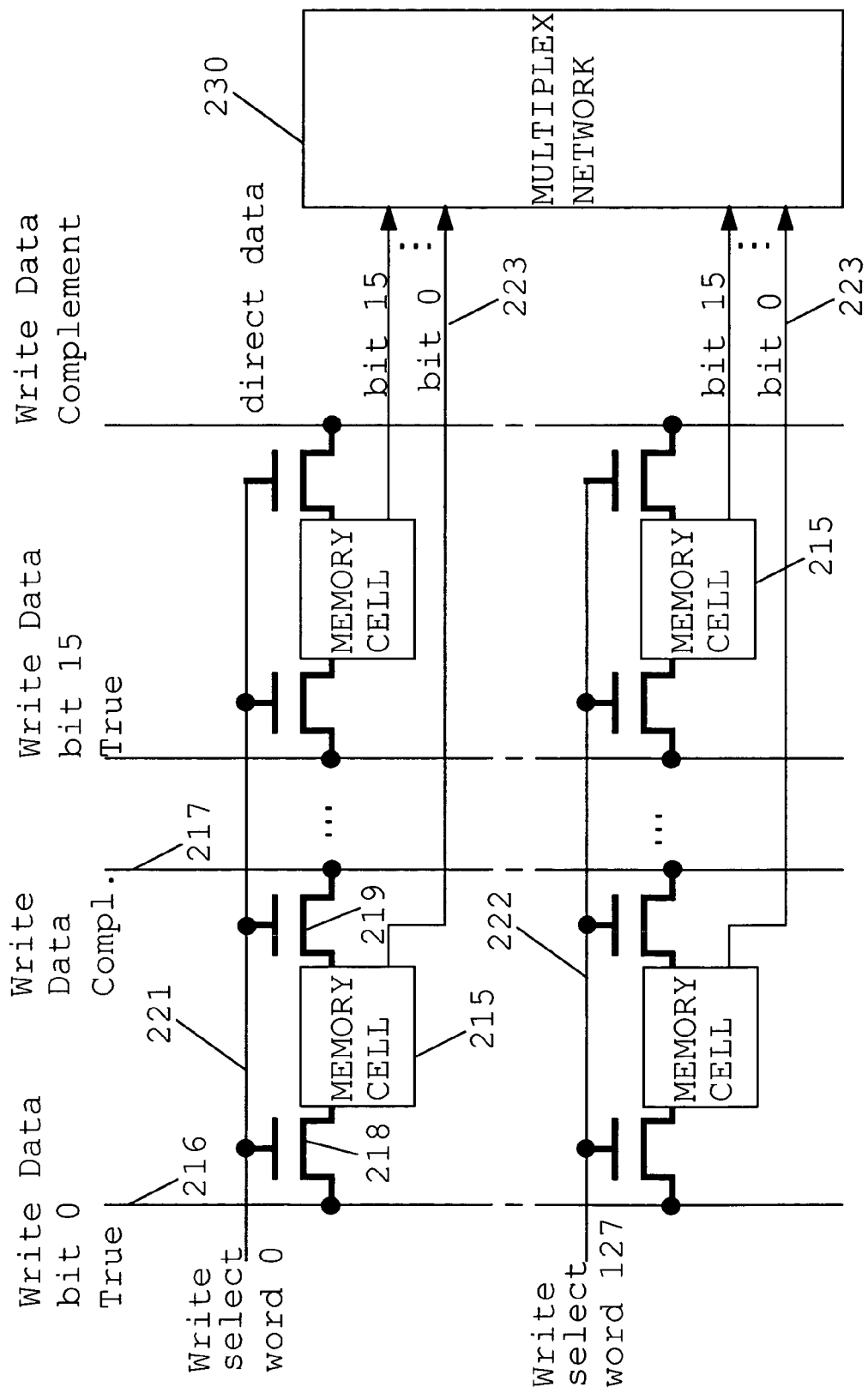
FIG. 3 a sectional block diagram of memory cells which may be used in the multiport array according to FIG. 2.

The FIG. 2 shows a preferred example of a multiport array 200 according to the invention in a more detailed block diagram. The multiport array 200 comprises an array 210 of static memory cells which stores 2048 bits organized in 128 words. Data are written into array 210 via a write port 211 and a write word decoder 212 which is designed to select one of 128 words in the array 210. The memory array 210 does not have a read selection or addressing circuitry. Instead, the memory cells of the array 210 provide a static output signal on a bus 213 to a multiplex network 230. FIG. 3 represents a section of the array 210. This section comprises four static memory cells 215 which have write data lines 216, 217 for true and complement bits. The write data lines 216, 217 are connected to the memory cells 215 via transistors 218, 219 which gate the bit signals to the memory cell if a write select word line, connected to the base of the transistors 218, 219, is activated. In FIG. 3 two write select word lines 221, 222 are shown of which line 221 is assigned to word 0 and line 222 is assigned to word 127. Each of the memory cells comprises a direct data bit line 223 providing a static read signal which indicates the data presently stored in the memory cell. Amplifier circuits not shown may be provided in the direct data bit lines 223 at the input of the multiplex network 230. FIG. 3 shows the direct data bit lines of the bits 0 and 15 of word 0 and the data bit lines of the bits 0 and 15 of word 127. The lines 223 are connected to the multiplex network 230 as shown in more detail in the FIGS. 5 and 6.

The multiplex network 230 is provided to perform both the addressing of the multiple data-out ports 0,1, . . . ,15 of the multiport array 200 and the selection of data which are gated to these ports. The multiplex network 230 comprises 16 multiplex arrays each of which is associated with one of the data-out ports 0 . . . 15. In FIG. 2 only multiplex arrays 231 and 232 are shown which are associated with the data-out ports 0 and 15 and designated 260 and 261. The multiplex arrays are connected to the data bit lines 223 in series. Each multiplex array has an address port such as the address ports 233 and 234 of the multiplex arrays 231 and 232. Each of the address ports provide a 10 bit read port address comprising a word address part and a bit address part. The outputs of the multiplex arrays are connected to registers such as register 241 at the output of multiplex array 231 and register 242 at the output of multiplex array 232. Each of the registers 241, 242 comprises two bit positions which are connected to a multiplex circuit 243, 244 respectively. A part of the bit address in the read port address is applied to line 245 to transfer the contents of one or the other of the bit positions in the registers 241, 242 to the data-out ports 260, 261.

Figure 4:
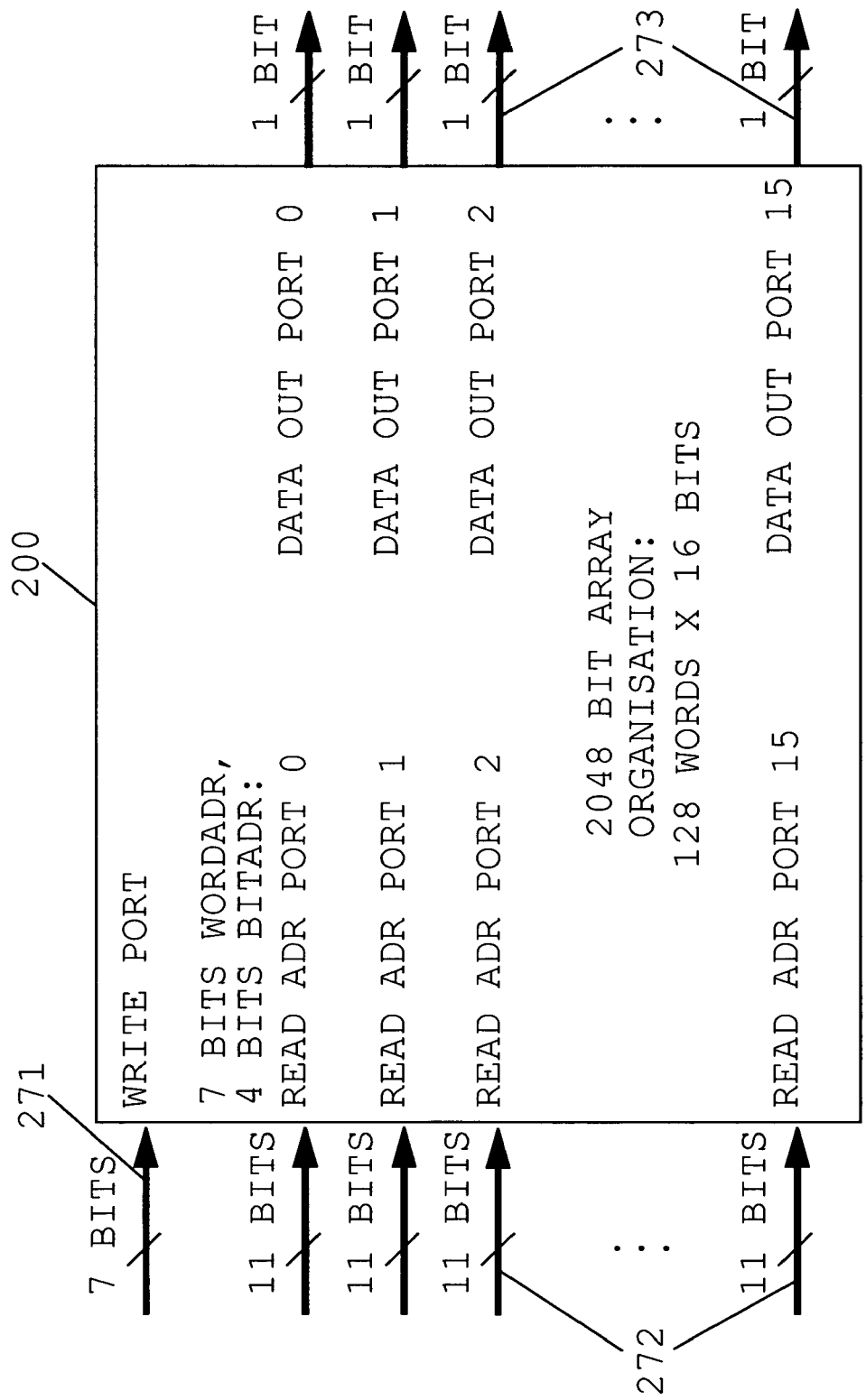
FIG. 4 the data and address ports of the array according to FIG. 2.

FIG. 4 shows an addressing scheme of the multiport array 200. It comprises a write address port 271 for the word addressing of the memory array 210 for performing a data write operation. The multiport array 200 further comprises sixteen read address ports 272 for addressing the sixteen multiplex arrays contained in the multiplex network 230. Furthermore, the multiport array 200 comprises sixteen data-out ports 273 which are selectable by the addresses applied to the address ports 272 where more than one or all data-out ports may be selected for a data output operation. As far as the addressing of the multiplex arrays is concerned, each of the read address ports 272 comprises 11 bits of which 7 bits are used as word address and 4 bits are used as bit address. A part of the bit address is used to selectively activate bit select lines as will be described below with reference to FIGS. 5 and 6. Another part of the bit address is used to perform a selection among the output signals of the multiplex arrays. This is shown in FIG. 2 for the multiplex arrays 231 and 232 wherein three bits of the bit address applied via address ports 233, 234 are used to activate bit select lines of that multiplex arrays, and one bit which is applied via line 245 is used to select one of two bits read out from the multiplex arrays 231 and 232. The address ports 233, 234 correspond to the read address ports 272 of FIG. 4.

Figure 5:
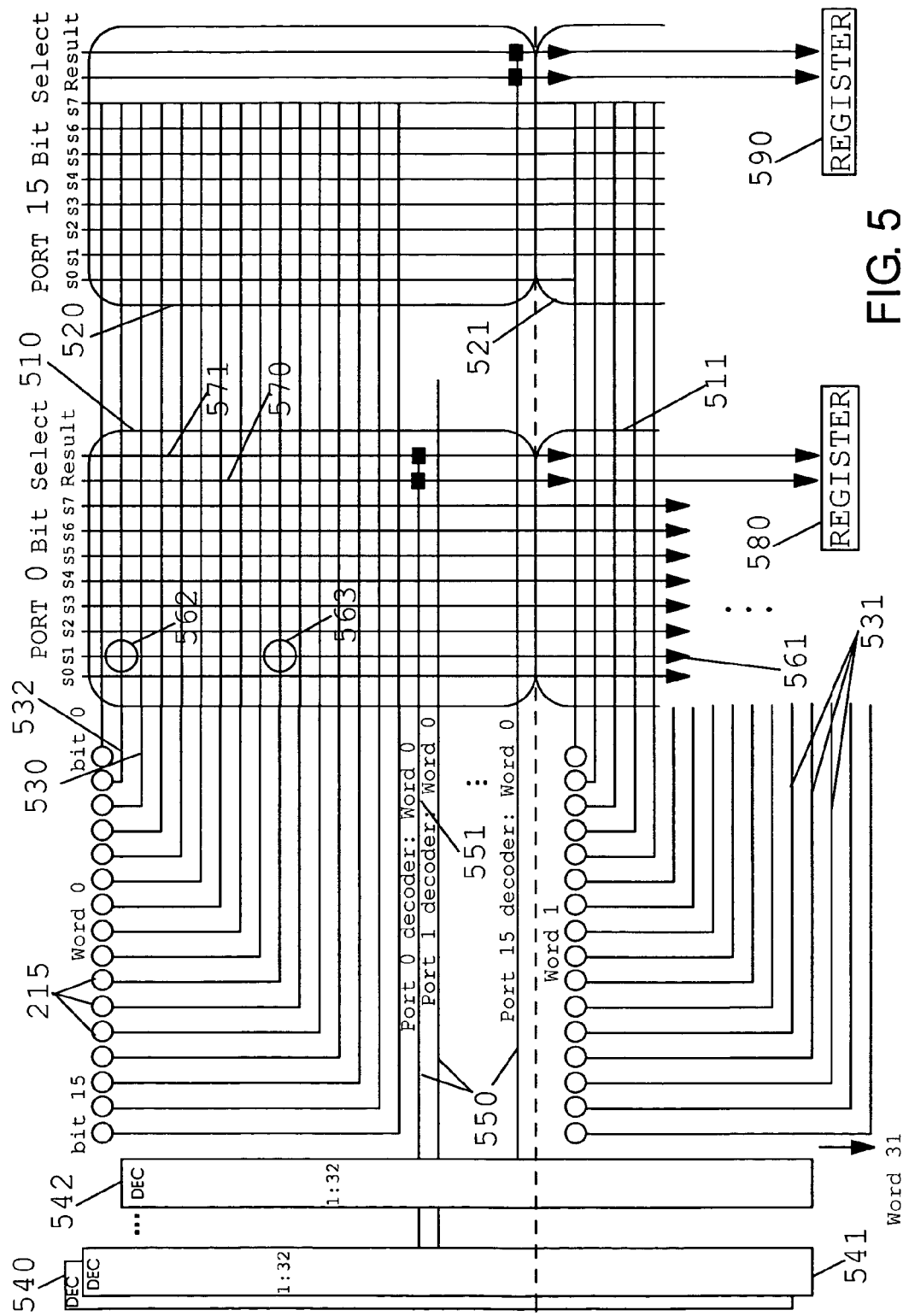
FIG. 5 a more detailed flow diagram of a part of the multiport array according to FIG. 2.

FIG. 5 relates to the implementation of one quadrant of the multiplex network 230 and one quadrant of the memory array 210. For simplicity reasons FIG. 5 shows only parts of the multiplex arrays of ports 0 and 15 in that quadrant. The quadrant shown comprises 32 of 128 read decoder ports to select one of 32 words for being used from the static data bit signals on lines 223. The whole multiplex network 230 comprises four such quadrants. Each of the multiplex arrays consists of 32 sub-arrays of which FIG. 5 shows only sub-array 510 assigned to word 0 and a part of sub-array 511 assigned to word 1 where both are associated with data-out port 0. Similarly, sub-arrays 520 and 521 belong to the data-out port 15. Sub-array 510 receives the data bits 0,1, . . . , 15 of word 0 from the memory cells 215 on data bit lines 530 which correspond to the lines 223 in FIG. 3. Accordingly, the sub-array 511 receives the data bits 0,1, . . . , 15 of word 1 from the memory cells 215 on the data bit lines 531. The data bit lines 530 and 531, which in FIG. 5 are oriented in horizontal direction, lead through all multiplex arrays until sub-arrays 520 and 521, respectively. The multiport array may be extended by adding further multiplex arrays comprising sub-arrays such as sub-arrays 520 and 521 and being connected to the data read lines 223 of the memory cells.

Port select decoders 540, 541, 542 are used to generate word read addresses for the multiplex sub-arrays and the data-out ports 0,1, . . . ,15. In FIG. 5 word read addresses for the multiplex sub-arrays of the word 0 are generated on word address lines 550. For example, an address signal on word address line 551 selects sub-array 510 and thus selects data-out port 0. The word read addresses serve also as signals which activate the selected multiplex array 231 or 232 while the multiplex arrays associated with ports which are not selected remain in an switched off status without power consumption.

Each multiplex sub-array has eight bit select lines 561 which are arranged in vertical direction and intersect with the data bit lines 530. At the intersections each of the bit select lines 561 is connected to selected one of the data bit lines 530 by a transmission gate as will be described below. By means of the bit select lines 561 a subset of data bits in the addressed multiplex sub-array is selected for forming the data-out port which is associated with that sub-array. In the example, shown in FIG. 5, by activating bit select line 561, which is assigned to the bit 1 of the multiplex sub-array 510, data bit lines 532 and 533 assigned to the bits 1 and 9 of word 0 are selected for port 0. This is indicated in FIG. 5 by two small circles 562, 563. Each of these circles represents a transmission gate which is conditioned by the activated bit select line 561. The output signal of the conditioned transmission gate is transferred by a pass gate to the output lines 570, 571 which are common to all sub-arrays of the multi-plex array assigned to port 0 and connected to a register 580. Similarly, the output lines of the multiplex array assigned to port 15, including the sub-arrays 520, 521, are connected to a register 590. The registers 580, 590 correspond to registers 241, 242 in FIG. 2.

Figure 6:
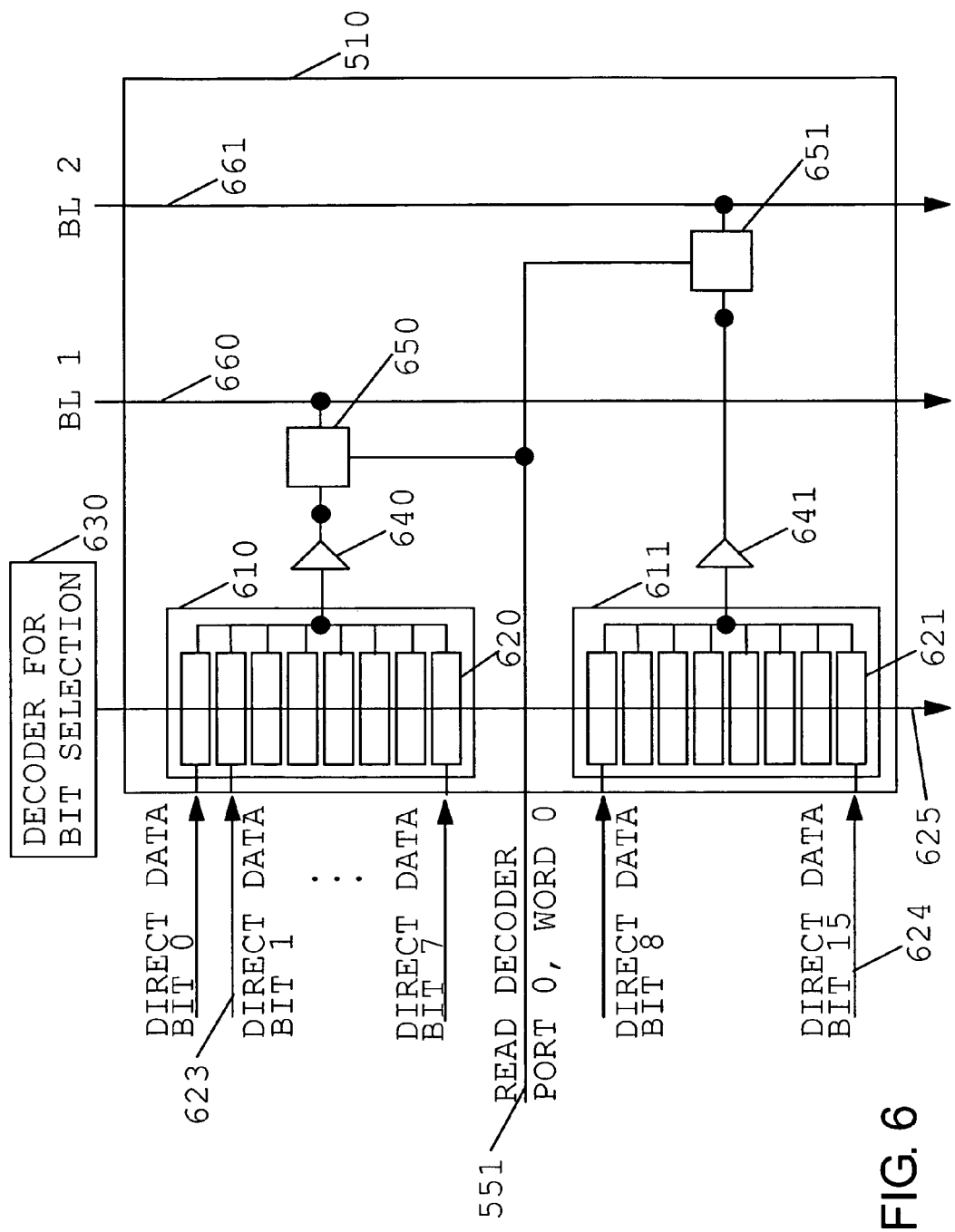
FIG. 6 a sectional block diagram of a multiplex network as used in the multiport array according to FIG. 2.

FIG. 6 shows the sub-array 510 in more detail. It contains two 8:1 multiplex circuits 610 and 611 each comprising a plurality of transmission gates 620, 621 which have a conventional design. The multiplex circuit 610 is assigned to the data bits 0,1, . . . ,7 and the multiplex circuit 611 is assigned to the bits 8 . . . 15. An address decoder 630 generates select signals on one of eight bit select lines 625 which are common to both multiplex circuits 610 and 611. The outputs of the transmission gates 620 of multiplex circuit 610 are ORed together and fed to an amplifier 640 which is connected via a pass gate 650 to a data line 660. Similarly, the outputs of the transmission gates 621 of multiplex circuit 611 are ORed together and fed to an amplifier 641 which is connected via a pass gate 651 to a data-out line 661. The pass gates 650, 651 are conditioned for passing output signals of the multiplex circuits 610 and 611 to the lines 660, 661 by the port read address on the word address line 551 from the port select decoder 540. By the conditioned transmission gate 620 of the multiplex circuit 610 one of the direct data bit lines 623 assigned to the data bits 0,1, . . . ,7 is gated to the data-out line 660. Similarly, by the conditioned transmission gate 621 of the multiplex circuit 611 one of the direct data bit lines 624 assigned to the data bits 8, . . . ,15 is gated to the data-out line 661. The data on the data-out lines 660, 661 are stored in the register 241.

Which one of the direct data bit lines 623 and 624 is gated to the data-out lines 660, 661 depends on the bit select line 625 which is activated to select one of the bits 0,1 . . . ,7 by multiplex circuit 610 and one of the bits 8 . . . 15 by multiplex circuit 611. The direct data bit lines 623 and 624 correspond to the lines 223 in FIG. 3. The bit select signal on line 245 (FIG. 2) determines which output of the register 241 is witched through by the multiplex circuit 243 to port 0. Similarly, the bit select signal on line 245 determines which output of the register 242 is switched through by the multiplex circuit 244 to port 15.

The sub-array 511 and the other sub-arrays of port 0 are correspondingly designed where word address lines 550 serve to condition pass gates which are connected to the data-out lines 660, 661. In the implementation described the sub-arrays of the other ports 1 . . . 14 have the same design. Alternatively, the multiplex arrays of the ports may have a different design which may even deviate from port to port. For example, the sub-array 520 may select two or more bits from word 0 for being transmitted to port 15. The same bits would then be selected from the sub-arrays assigned to the other words for being transmitted to port 15.

The multiplex arrays of the ports 1 . . . 15 are addressed by word address lines from the port select decoders 541, 542 each associated with one of the ports 1 . . . 15. Addressing of the multiplex arrays may be performed in parallel to allow a simultaneous data read-out on more than one of the ports 0,1, . . . ,15.

Figure 7:
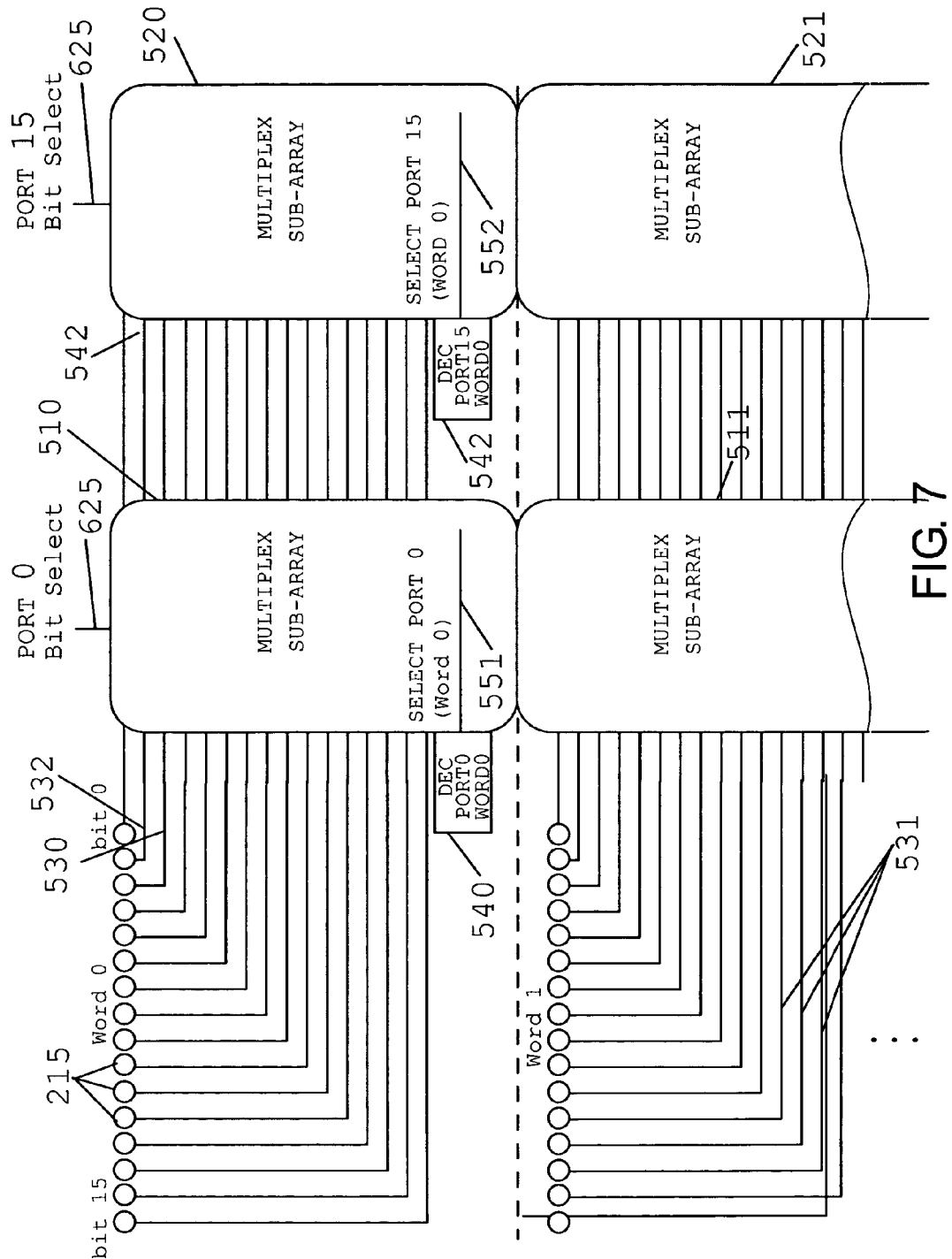
FIG. 7 a sectional block diagram of an alternative implementation of the multiplex network suitable for being used in the multiport array according to FIG. 2.

FIG. 7 shows a modified implementation of the port select decoders. In this implementation the port select decoders are located closely to the multiplex arrays 231, 232. This is shown in FIG. 7 for the sub-arrays 510 and 520 of the multiplex array 231 where the same reference numbers are used as in FIG. 5. A word 0 section of port select decoder 540 is directly connected to sub-array 510 and generates on line 551 a select signal for this subarray. Similar sections of decoder 540, which are assigned to the other words, are connected to the other sub-arrays of multiplex array 231 associated with port 0. Correspondingly, a word 0 section of port select decoder 542 is directly connected to sub-array 511 and generates on line 552 a select signal for this sub-array. Similar sections of decoder 542, which are assigned to the other words, are connected with the other sub-arrays of multiplex array 232 associated with port 15. The sub-arrays are only active if there is a select signal on lines 551 or 552. Thus, there is no power consumption for those sub-arrays which are not selected.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A multiport array which includes an array of memory cells located at intersections of bit write lines and word select lines and having data read lines, said array comprising:
   a read section separated from the array of memory cells and including a plurality of data-out ports each consisting of a predetermined number of lines; and
   in the read section, a plurality of bit select arrays each associated with one of the data-out ports, the bit select arrays being connected to the data read lines of the memory cells and including transmission elements which connect selected ones of the data read lines to the associated data-out port.

2. The multiport array according to claim 1, wherein the bit select arrays comprise address lines for addressing one of the plurality of data-out ports for a data read out operation.

3. The multiport array according to claim 1, wherein each of the bit select arrays comprises a multiplex array having first lines which are connected to the data read lines of the memory cells and the second lines which intersect with the first lines and wherein the second lines select at least one of the first lines for being connected to output lines of the multiplex arrays by conditioning transmission gates located at the intersection between the first and second lines.

4. The multiport array according to claim 3, further comprising port select decoders connected to a word address part of the read address ports for selecting a multiplex array and its associated data-out port for a data read out operation.

5. The multiport array according to claim 4, wherein the select signals are used to activate the selected multiplex arrays from a switched off status to a port select status.

6. The multiport array according to claim 3, wherein the port select decoders are closely located to the multiplex arrays.

7. The multiport array according to claim 3, wherein the read address ports comprises bit select lines which serve as second lines to select at least one of the data bit lines from the memory array.

8. The multiport array according to claim 1, wherein the memory cells of the memory array are static cells which provide continuing output signal.

9. The multiport array according to claim 8, wherein the continuing output signal is provided by the cells in parallel.

10. The multiport array according to claim 1, wherein the memory array and the multiplex arrays have a word configuration where the bits of each word form the input of a sub-array of the multiplex arrays.

11. The multiport array according to claim 10, further including a sub-array which comprises two multiplex circuits which are connected in series and have common bit select lines, each of said multiplex circuits being connected only to a part or the data bit lines.

12. The multiport array according to claim 11, wherein each multiplex circuits is connected to a separate output line, and wherein the read address ports include a select line for gating of the output lines to the associated data-out port.

13. A method for operating a multiport array which includes an array of memory cells which are located at intersections of bit write lines and word select lines and which have data read lines, said method comprising the steps of:
   separating from the array of memory cells a read section comprising a plurality of data-out ports each consisting of a predetermined number of lines;
   dividing the read section into a plurality of bit select arrays each associated with one of the data-out ports;
   connecting the bit select arrays to data read lines of the memory cells; and
   transmitting data signals by at least one of the bit select arrays from selected ones of the data read lines to selected ones of the lines contained in the associated data-out port.

14. The method according to claim 13, further comprising the step of addressing the bit select arrays for selecting at least one of the plurality of data-out ports for a data read-out operation.

15. The method according to claim 14, further comprising the step of performing a parallel data read-out on more than one data-out ports.

16. The method according to claim 13, further comprising the step of performing a multiplex operation in the bit select arrays for gating selected data read lines of the memory cells through to a reduced number of output lines which form the associated data-out port.

17. The method according to claim 14, further comprising the step of using a part of the read address port lines as bit select lines of the multiplex operation for gating at least one of the data bit lines from the memory array to one of the data-read out ports.

18. The method according to claim 16, further comprising the step of connecting a word address part of the read address ports to port select decoders for selecting a multiplex array and its associated data-out port for a data read out operation.

19. The method according to claim 18, further comprising the step of activating the selected multiplex arrays from a switched off status to a port select status by the signals from the port select decoders.

20. The method according to claim 13, wherein the memory cells of the memory array provide a continuing output signal.

21. The method according to claim 20, wherein the continuing output signal is provided by the memory cells of the memory array in parallel.

22. The method according to claim 16, further comprising the step of organizing the memory array and the multiplex arrays in a word configuration where the bits of each word form the input of the multiplex operation.

23. The method according to claim 16, further comprising the steps of dividing the multiplex operation in two partial operations each of which is applied to a part or the data bit lines and selecting the result of one of partial operations as data-out signal of the associated data-out port.

24. The method according to claim 13 further comprising the step of extending the multiport array by adding further bit select arrays being connected to the data read lines of the memory cells.

* * * * *